(12) United States Patent
Bu et al.

(10) Patent No.: US 12,148,819 B2
(45) Date of Patent: Nov. 19, 2024

(54) SYSTEM AND METHOD FOR BI-DIRECTIONAL TRENCH POWER SWITCHES

(71) Applicant: IDEAL POWER INC., Austin, TX (US)

(72) Inventors: Jiankang Bu, Austin, TX (US); Constantin Bulucea, Santa Clara, CA (US); Alireza Mojab, Austin, TX (US); Jeffrey Knapp, Caldwell, NJ (US); Robert Daniel Brdar, Driftwood, TX (US)

(73) Assignee: IDEAL POWER INC., Austin, TX (US)

( * ) Notice: Subject to any disclaimer, the term of this patent is extended or adjusted under 35 U.S.C. 154(b) by 0 days.

(21) Appl. No.: 18/539,959

(22) Filed: Dec. 14, 2023

(65) Prior Publication Data
US 2024/0113210 A1    Apr. 4, 2024

Related U.S. Application Data

(62) Division of application No. 17/884,803, filed on Aug. 10, 2022, now Pat. No. 11,881,525.
(Continued)

(51) Int. Cl.
*H01L 29/747*    (2006.01)
*H01L 29/08*    (2006.01)
(Continued)

(52) U.S. Cl.
CPC .......... *H01L 29/747* (2013.01); *H01L 29/083* (2013.01); *H01L 29/1012* (2013.01); *H01L 29/66386* (2013.01)

(58) Field of Classification Search
CPC ............ H01L 29/747; H01L 29/66386; H01L 29/0692; H01L 29/66234; H01L 29/732; H01L 29/66295; H01L 29/083; H01L 29/1012; H01L 29/0821; H01L 29/1004; H01L 29/41708; H01L 29/42304; H01L 21/8222; H01L 21/8248–8249; H01L 29/0804–0826
See application file for complete search history.

(56) References Cited

U.S. PATENT DOCUMENTS

| | | | |
|---|---|---|---|
| 7,220,661 | B1 | 5/2007 | Yu et al. |
| 8,089,129 | B2 | 1/2012 | Disney et al. |

(Continued)

OTHER PUBLICATIONS

International Search Report and Written Opinion mailed Oct. 27, 2022 for International Application No. PCT/US2022/039915, 7 pages.

*Primary Examiner* — Wasiul Haider
(74) *Attorney, Agent, or Firm* — Dickinson Wright PLLC; Mark E. Scott

(57) ABSTRACT

Bi-directional trench power switches. At least one example is a semiconductor device comprising: an upper base region associated with a first side of a substrate of semiconductor material; an upper-CE trench defined on the first side, the upper-CE trench defines a proximal opening at the first side and a distal end within the substrate; an upper collector-emitter region disposed at the distal end of the upper-CE trench; a lower base region associated with a second side of substrate; and a lower collector-emitter region associated with the second side.

17 Claims, 8 Drawing Sheets

Related U.S. Application Data

(60) Provisional application No. 63/231,351, filed on Aug. 10, 2021.

(51) Int. Cl.
*H01L 29/10* (2006.01)
*H01L 29/66* (2006.01)

(56) References Cited

U.S. PATENT DOCUMENTS

| | | |
|---|---|---|
| 8,829,562 B2 | 9/2014 | Schulze et al. |
| 10,374,070 B2 | 8/2019 | Wood |
| 2005/0029568 A1 | 2/2005 | Tokuda et al. |
| 2008/0013351 A1 | 1/2008 | Alexander |
| 2008/0031019 A1 | 2/2008 | Alexander |
| 2010/0067272 A1 | 3/2010 | Alexander |
| 2011/0292697 A1 | 12/2011 | Alexander |
| 2012/0008353 A1 | 1/2012 | Alexander |
| 2012/0014151 A1 | 1/2012 | Alexander |
| 2012/0020129 A1 | 1/2012 | Alexander |
| 2012/0033464 A1 | 2/2012 | Alexander |
| 2012/0051100 A1 | 3/2012 | Alexander |
| 2012/0268975 A1 | 10/2012 | Alexander |
| 2012/0274138 A1 | 11/2012 | Bundschuh et al. |
| 2012/0279567 A1 | 11/2012 | Alexander |
| 2013/0038129 A1 | 2/2013 | Bundschuh et al. |
| 2013/0063988 A1 | 3/2013 | Alexander |
| 2013/0063994 A1 | 3/2013 | Alexander |
| 2013/0069605 A1 | 3/2013 | Alexander |
| 2013/0114303 A1 | 5/2013 | Bundschuh et al. |
| 2013/0114311 A1 | 5/2013 | Alexander |
| 2013/0114315 A1 | 5/2013 | Alexander |
| 2013/0114316 A1 | 5/2013 | Alexander |
| 2013/0307336 A1 | 11/2013 | Bundschuh et al. |
| 2013/0314096 A1 | 11/2013 | Bundschuh et al. |
| 2014/0029320 A1 | 1/2014 | Alexander |
| 2014/0036554 A1 | 2/2014 | Alexander |
| 2014/0133203 A1 | 5/2014 | Alexander |
| 2014/0319911 A1 | 10/2014 | Alexander |
| 2014/0368038 A1 | 12/2014 | Alexander |
| 2014/0375287 A1* | 12/2014 | Blanchard ............ H01L 29/0619 323/271 |
| 2014/0376291 A1 | 12/2014 | Blanchard et al. |
| 2015/0003115 A1 | 1/2015 | Barron et al. |
| 2015/0029769 A1 | 1/2015 | Blanchard et al. |
| 2015/0054552 A1 | 2/2015 | Blanchard et al. |
| 2015/0061569 A1 | 3/2015 | Alexander et al. |
| 2015/0061732 A1 | 3/2015 | Blanchard et al. |
| 2015/0214055 A1 | 7/2015 | Blanchard et al. |
| 2015/0214299 A1 | 7/2015 | Blanchard |
| 2015/0214782 A1 | 7/2015 | Alexander |
| 2015/0214784 A1 | 7/2015 | Alexander |
| 2015/0222146 A1 | 8/2015 | Alexander |
| 2015/0222147 A1 | 8/2015 | Alexander |
| 2015/0222194 A1 | 8/2015 | Bundschuh |
| 2015/0270771 A1 | 9/2015 | Alexander et al. |
| 2015/0270837 A1 | 9/2015 | Alexander et al. |
| 2015/0280613 A1 | 10/2015 | Alexander et al. |
| 2015/0288358 A1 | 10/2015 | Alexander et al. |
| 2015/0303915 A1 | 10/2015 | Alexander et al. |
| 2015/0311777 A1 | 10/2015 | Alexander et al. |
| 2015/0318704 A1 | 11/2015 | Barron et al. |
| 2016/0006430 A1 | 1/2016 | Alexander et al. |
| 2016/0072400 A1 | 3/2016 | Alexander |
| 2016/0197143 A1 | 7/2016 | Naito |
| 2016/0322350 A1 | 11/2016 | Blanchard |
| 2016/0322484 A1 | 11/2016 | Blanchard |
| 2016/0344300 A1 | 11/2016 | Alexander |
| 2016/0351399 A1 | 12/2016 | Blanchard et al. |
| 2017/0047922 A1 | 2/2017 | Alexander |
| 2017/0085179 A1 | 3/2017 | Alexander et al. |
| 2017/0104478 A1 | 4/2017 | Alexander et al. |
| 2017/0126225 A1 | 5/2017 | Alexander et al. |
| 2017/0271328 A1 | 9/2017 | Alexander |
| 2017/0288561 A1 | 10/2017 | Lemberg et al. |
| 2017/0317575 A1 | 11/2017 | Alexander |
| 2018/0026122 A1 | 1/2018 | Blanchard et al. |
| 2018/0109101 A1 | 4/2018 | Alexander |
| 2018/0130898 A1 | 5/2018 | Blanchard et al. |
| 2018/0219061 A1 | 8/2018 | Alexander et al. |
| 2018/0226254 A1 | 8/2018 | Blanchard et al. |
| 2018/0286853 A1 | 10/2018 | Mallikarjunaswamy |
| 2019/0088645 A1 | 3/2019 | Alexander |
| 2019/0097031 A1 | 3/2019 | Alexander et al. |
| 2019/0140548 A1 | 5/2019 | Alexander |
| 2019/0267810 A1 | 8/2019 | Johns |
| 2020/0006945 A1 | 1/2020 | Lemberg et al. |
| 2020/0058780 A1 | 2/2020 | Alexander et al. |
| 2020/0111672 A1 | 4/2020 | Blanchard et al. |
| 2020/0243674 A1 | 7/2020 | Alexander et al. |
| 2021/0313461 A1 | 10/2021 | Blanchard et al. |
| 2021/0359678 A1 | 11/2021 | Mojab |
| 2021/0384900 A1 | 12/2021 | Mojab |
| 2022/0077852 A1 | 3/2022 | Mojab |
| 2022/0157974 A1 | 5/2022 | Blanchard et al. |
| 2022/0190115 A1 | 6/2022 | Mojab et al. |
| 2023/0066664 A1 | 3/2023 | Mojab et al. |
| 2023/0299188 A1 | 9/2023 | Blanchard et al. |
| 2023/0386987 A1 | 11/2023 | Bu et al. |

\* cited by examiner

SYSTEM AND METHOD FOR BI-DIRECTIONAL TRENCH POWER SWITCHES

CROSS-REFERENCE TO RELATED APPLICATIONS

This application is a divisional of U.S. application Ser. No. 17/884,803 filed Aug. 10, 2022 and originally titled "System and Method For Bi-Directional Trench Power Switches." The '803 Application claims the benefit of U.S. Provisional App. No. 63/231,351 filed Aug. 10, 2021 titled "System and Method for Bi-Directional Trench Power Switches." Both applications are incorporated by reference herein as if reproduced in full below.

BACKGROUND

A bidirectional bipolar junction transistor (hereafter B-TRAN) is junction transistor constructed with a base and collector-emitter on a first side of a semiconductor material, and a distinct and separate base and collector-emitter on a second side of the semiconductor material opposite the first side. When properly configured by an external driver, electrical current may selectively flow through a B-TRAN in either direction, and thus B-TRAN devices are considered bidirectional devices. Whether a collector-emitter is considered a collector (e.g., current flow into the B-TRAN) or an emitter (e.g., current flow out of the B-TRAN) depends on the applied external voltage and thus the direction of current flow through the B-TRAN.

When flowing current through the collector-emitters, B-TRAN devices exhibit a voltage drop collector-to-emitter designated $V_{CEON}$. Inasmuch as the B-TRAN devices are many times used as power switches, any system or method that reduces $V_{CEON}$ reduces overall power loss and thus increases efficiency.

SUMMARY

Bi-directional power switches. At least one example is a semiconductor device comprising: an upper base region associated with a first side of a substrate of semiconductor material; an upper-CE trench defined on the first side, the upper-CE trench defines a proximal opening at the first side and a distal end within the substrate; an upper collector-emitter region disposed at the distal end of the upper-CE trench; a lower base region associated with a second side of the substrate; and a lower collector-emitter region associated with the second side.

In the example semiconductor device, the upper-CE trench may define a depth of between and including 10 and 50 microns.

The example semiconductor device may further comprise: an upper-base trench defined on the first side, the upper-base trench defines a proximal opening at the first side and a distal end within the substrate; wherein the upper base region is disposed at the distal end of the upper-base trench. The upper-base trench defines a first depth, the upper-CE trench defines a second depth, and the first depth may be greater than the second depth.

The example semiconductor device may further comprise: a lower-CE trench defined on the second side, the lower-CE trench defines a proximal opening at the second side and a distal end within substrate; and wherein the lower collector-emitter region is disposed at the distal end of the lower-CE trench. The upper-CE trench may further comprise an obround and the lower-CE trench may further comprise an obround. The upper-CE trench and the lower-CE trench may be congruent to within manufacturing tolerances. The example semiconductor device may further comprise: an upper-base trench defined on the first side, the upper-base trench defines a proximal opening at the first side and a distal end within the substrate; wherein the upper base region is disposed at the distal end of the upper-base trench; a lower-base trench defined on the second side, the lower-base trench defines a proximal opening at the second side and a distal end within the substrate; wherein the lower base region is disposed at the distal end of the lower-base trench. The upper-base trench defines a first depth, the upper-CE trench defines a second depth, and wherein the first depth may be greater than the second depth; and wherein the lower-base trench defines a third depth, the lower-CE trench defines a fourth depth, and wherein the third depth may be greater than the fourth depth.

The example semiconductor device may further comprises a layer of oxide disposed on sidewalls of the upper-CE trench.

The example semiconductor device may further comprise the upper base region is P-type, and the upper collector-emitter region is N-type.

Yet another example is a method of making a semiconductor device, the method comprising: doping to create an upper base region associated with a first side of a substrate of semiconductor material; etching the first side to create an upper-CE trench, the upper-CE trench defines a proximal opening at the first side and a distal end within the substrate; doping through the distal end of the upper-CE trench to create an upper collector-emitter region; doping to create a lower base region associated with a second side of the substrate; and doping to create a lower collector-emitter region associated with the second side.

In the example method, etching to create the upper-CE trench may further comprise etching such that the upper-CE trench defines a depth of between and including 10 and 75 microns.

The example method may further comprise prior to doping to create the upper base region, etching the first side to create an upper-base trench, the upper-base trench defines a proximal opening at the first side and a distal end within the substrate of semiconductor material; and doping to create the upper base region may further comprise doping through the distal end of the upper-base trench. The upper-base trench defines a first depth, the upper-CE trench defines a second depth, and the first depth may be greater than the second depth.

The example method may further comprise, prior to doping to create the lower collector-emitter region: etching a second side of the substrate to create a lower-CE trench, the lower-CE trench defines a proximal opening at the second side and a distal end within the substrate of semiconductor material; and doping to create the lower collector-emitter region may further comprise doping through the distal end of the lower-CE trench. The example method may further comprise: prior to doping to create the upper base region, etching the first side to create an upper-base trench, the upper-base trench defines a proximal opening on the first side and a distal end within the substrate of semiconductor material; and doping to create the upper base region may further comprise doping through the distal end of the upper-base trench; prior to doping to create the lower base region, the example method may further comprise etching the second side to create a lower-base trench, the lower-base trench defines a proximal opening on the second side and a distal end within the substrate of semiconductor material; and doping to create the lower base region may further comprise doping through the distal end of the lower-base trench. The upper-base trench defines a first depth, the upper-CE trench defines a second depth, and the first depth may be greater than the second depth; and the lower-base trench defines a third depth, the lower-CE trench defines a fourth depth, and wherein the third depth may be greater than the fourth depth.

The example method may further comprise: placing a first layer of oxide on sidewalls of the upper-CE trench; placing a second layer of oxide on sidewalls of the upper-base trench; placing a third layer of oxide on sidewalls of the lower-CE trench; and placing a fourth layer of oxide on sidewalls of the lower-base trench.

In the example method, doping to create the upper base region may further comprising implanting to create a P-type the upper base region, and wherein doping to create the upper collector-emitter region further comprising implanting to create a P-type collector-emitter region.

BRIEF DESCRIPTION OF THE DRAWINGS

For a detailed description of example embodiments, reference will now be made to the accompanying drawing (not necessarily to scale) in which.

DEFINITIONS

Figure 1:
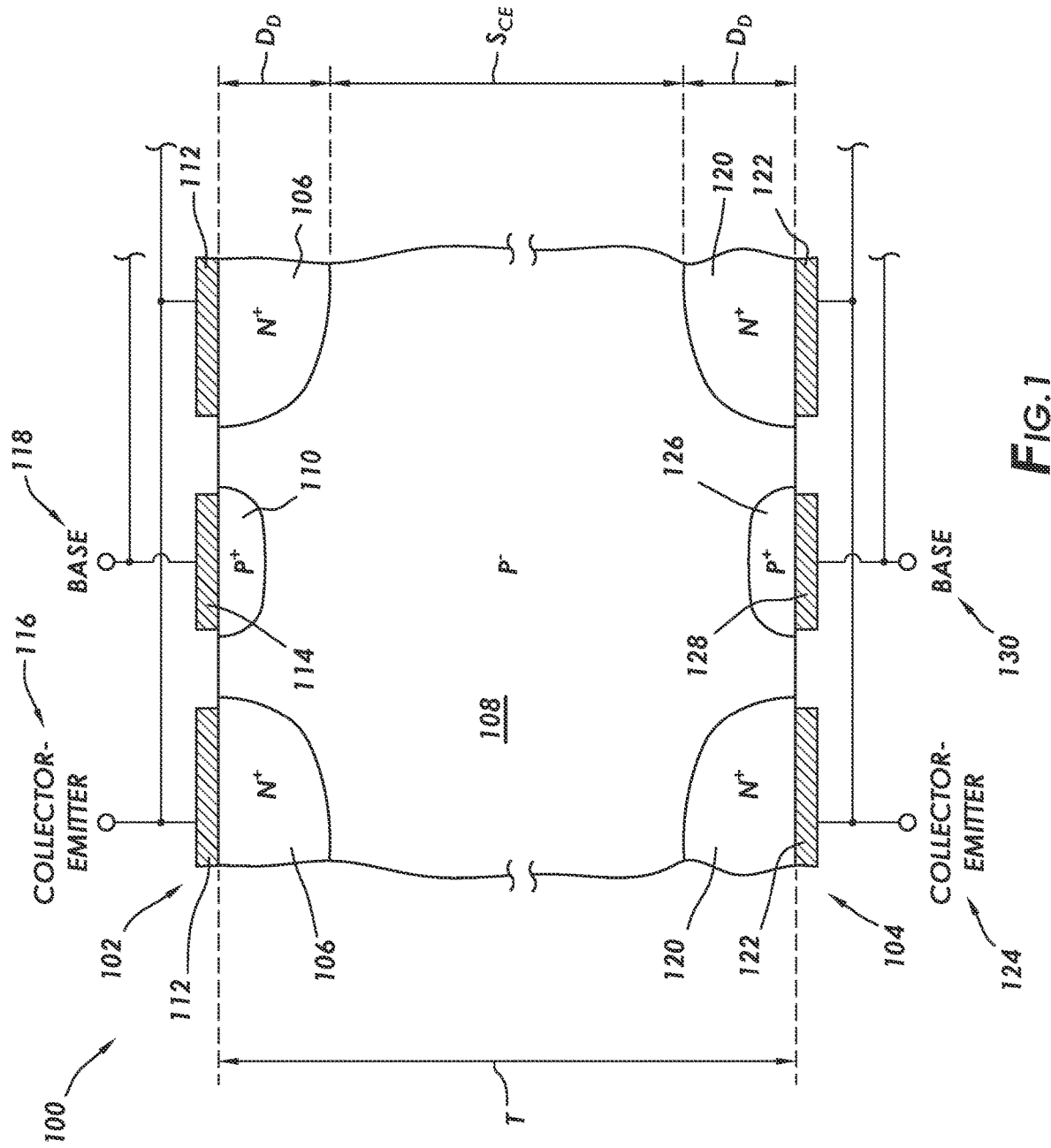
FIG. 1 shows a cross-sectional view of a portion of B-TRAN.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"About" in reference to a recited parameter shall mean the recited parameter plus or minus ten percent (+/−10%) of the recited parameter.

"Bidirectional double-base bipolar junction transistor" shall mean a junction transistor having a base and a collector-emitter on a first face or first side of a substrate of semiconductor material, and having a base and a collector-emitter on a second face or second side of the substrate. The base and the collector-emitter on the first side are distinct from the base and the collector-emitter on the second side. An outward pointing vector normal to the first side points an opposite direction to an outward pointing vector normal to the second side.

"Upper" shall mean an object or region is associated a first side of a substrate of a semiconductor device, and shall not be read to imply a location of with respect to gravity.

"Lower" shall mean an object or region is associated a second side of a substrate of a semiconductor device opposite the first side, and shall not be read to imply a location with respect to gravity.

"Base" shall mean a base of a bidirectional double-base bipolar junction transistor.

"Collector-emitter" shall mean a collector-emitter of a bidirectional double-base bipolar junction transistor. Whether the collector-emitter operates as collector or an emitter is controlled by polarity of a voltage applied across the bidirectional double-base bipolar junction transistor.

"Ohmic contact" shall mean a non-rectifying electrical junction between two materials (e.g., a metal and a semiconductor).

"Substrate" of semiconductor material shall mean a semiconductor material on and/or within which transistor is fabricated. The fact that certain portions of the transistor (e.g., collector-emitter region, base region) may reside within the substrate shall not obviate the semiconductor material's status as a substrate.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art understands that the following description has broad application, and the discussion of any embodiment is meant only to be exemplary of that embodiment, and not intended to intimate that the scope of the disclosure, including the claims, is limited to that embodiment.

Various examples are directed to bidirectional double-base bipolar junction transistors (hereafter B-TRANS) in which the collector-emitters on at least one side of a substrate of semiconductor material are created by trench-tip doping such that collector-emitter regions reside below the surface and within the substrate. In some cases, the collector-emitters on both sides of the substrate are created by trench-tip doping. In this way, the effective distance between the collector-emitter regions are closer together, which may lower $V_{CEON}$ during periods of conduction, and also may lower leakage current between the collector-emitter regions and associated base regions during non-conductive periods. In yet still further examples, the base regions on one or both sides of the substrate are created by trench-tip doping and thus the base region(s) reside below the surface and within the substrate. The placement of the base regions may reduce undesirable pinch-off of base current flow during periods of conduction. The specification first turns to an example B-TRAN device to orient the reader.

FIG. 1 shows a partial cross-sectional view of a portion of a B-TRAN. In particular, FIG. 1 shows a B-TRAN 100 having an upper face or upper side 102 and a lower face or lower side 104. The designations "upper" and "lower" are arbitrary and used merely for convenience of the discussion. The upper side 102 faces a direction opposite the lower side 104.

The upper side 102 includes a collector-emitter region 106 which forms a junction with the drift or bulk region 108. The upper side 102 further defines a base region 110 disposed in association with the collector-emitter region 106. The collector-emitter region 106 is electrically coupled to a collector-emitter contact 112, such as a metallic material applied through windows in an insulation material (not specifically shown) covering the upper side 102. The upper side 102 further includes a base region 110 which forms a junction with the bulk region 108. The base region 110 is electrically coupled to a base contact 114, such as a metallic material. In the view of FIG. 1, two collector-emitter contacts 112 and associated regions are shown, and only one base contact 114 and associated region is shown; however, in example systems two or more collector-emitter contacts and associated regions may be implemented, and two or more base contacts and associated regions may be implemented. The collector-emitter contacts are coupled together to form an upper collector-emitter 116. The base contacts are coupled together to form an upper base 118.

Similarly, the lower side 104 includes a collector-emitter region 120 which forms a junction with the bulk region 108, and a collector-emitter contact 122 that is electrically coupled to the collector-emitter region 120. The lower side 104 includes a base region 126 and a base contact 128 that is electrically coupled to the base region 126. In the view of FIG. 1, two collector-emitter contacts 122 and associated regions are shown, and only one base contact 128 and associated region is shown; however, in example systems two or more collector-emitter contacts and associated regions may be implemented, and two or more base contacts and associated regions may be implemented. The collector-emitter contacts on the lower side 104 are coupled together to form a lower collector-emitter 124. The base contacts on the lower side 104 are coupled together to form a lower base 130.

The example B-TRAN 100 is an NPN structure, which means the collector-emitter regions 106 and 120 are N-type, the base regions 110 and 126 are P-type, and the bulk region 108 is P-type. However, PNP-type B-TRAN devices are also contemplated but not shown so as not to unduly lengthen the discussion.

Figure 2:
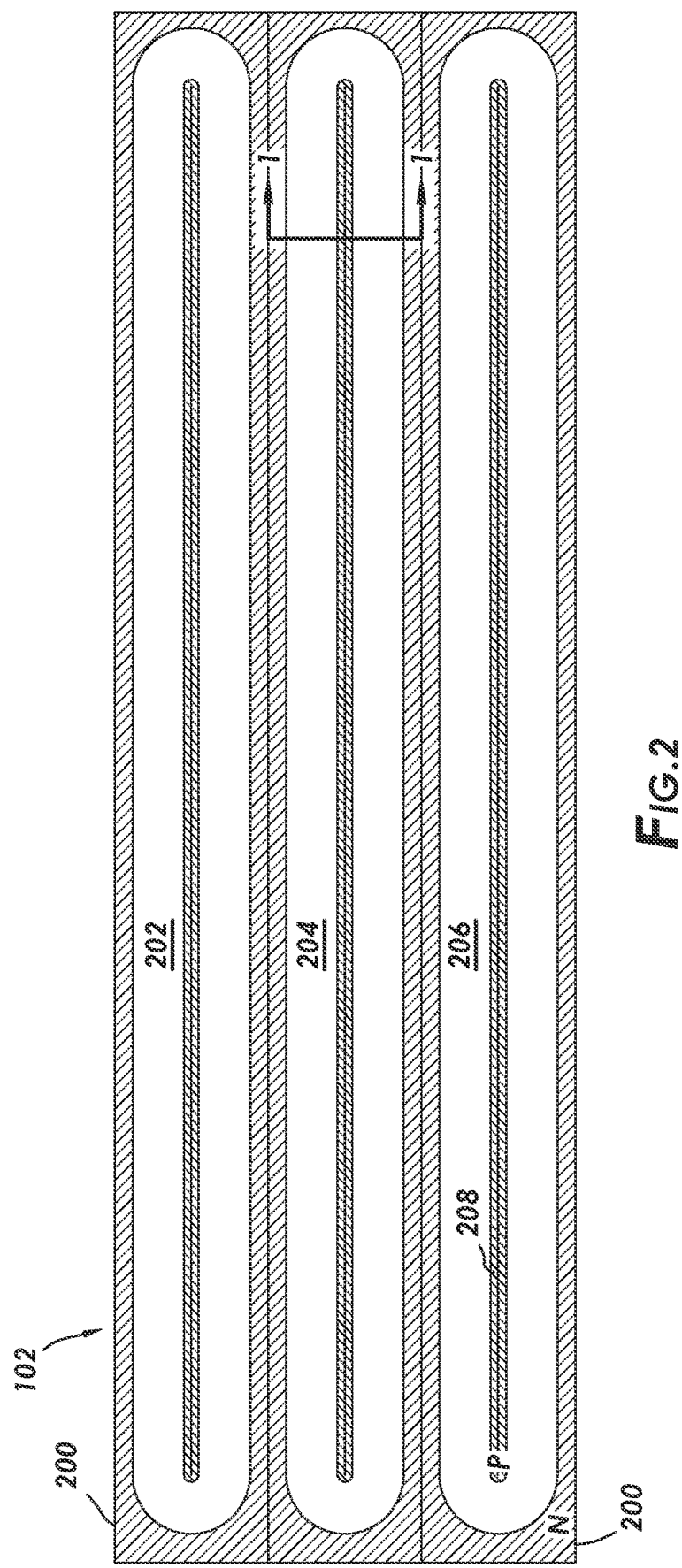
FIG. 2 shows an overhead view of the upper side of a substrate of semiconductor material of FIG. 1 during an intermediate stage of the construction of the B-TRAN.

FIG. 2 shows an overhead view of the upper side 102 of the substrate during an intermediate stage of the construction of the B-TRAN 100 of FIG. 1. In particular, visible in FIG. 2 is a collector-emitter region 200. The collector-emitter region 200 defines several internal regions that are not doped, such as internal regions 202, 204, and 206. Defined within the example internal region 206 is a base region 208. Consider, as an example, that the base region 208 is a P+ region and the collector-emitter region 200 is an N+ region, and thus the cross-sectional view of FIG. 1 may be considered to have been taken along line 1-1 of FIG. 2; however, note that FIG. 2 shows the upper side 102 of the semiconductor substrate prior to metal deposition that creates the example collector-emitter contacts 112 (FIG. 1) and base contact 114 (FIG. 1).

Retuning to FIG. 1, in the example B-TRAN 100 the thickness T of the substrate may be on the order of 250 micrometers (hereafter just microns) to 300 microns. The example collector-emitter regions 106 on the upper side 102 are doped regions implanted with dopant atoms impinging on the surface of the upper side 102 and having a diffusion depth DD into the substrate. Similarly, the example collector-emitter regions 120 on the lower side 104 are doped regions implanted with dopant atoms impinging the surface of the lower side 104 and having the diffusion depth DD into the substrate. The diffusion depths of the collector-emitter regions result in a separation or spacing SCE between the collector-emitter regions.

Consider a situation in which the B-TRAN 100 has an externally-applied voltage with the collector-emitter 116 on the upper side 102 having a higher voltage than the collector-emitter 124 on the lower side 104. When the B-TRAN 100 is fully conductive, electrical current flows from the collector-emitter region 106 acting as a collector, through the bulk region 108, to the collector-emitter region 120 on the lower side 104 acting as an emitter. Even when the example B-TRAN 100 is fully saturated, the current flow through the B-TRAN 100 causes voltage drop VCEON (e.g., 1.0V to 0.2V) from the collector to the emitter, the majority of which is attributable to the voltage drop associated with the current flow through bulk region 108. Moreover, the proximity of the base regions and collector-emitter regions to the respective surfaces may result leakage current between those regions when the B-TRAN 100 is non-conductive.

Various examples may reduce the voltage drop $V_{CEON}$, and likewise reduce the leakage current from collector-emitter regions to associated base regions, by separating or distancing the collector-emitter regions from the surface of the substrate. More particularly, in example B-TRANs the collector-emitter regions on at least one side of the substrate are created by placing or implanting dopant materials through a trench such that collector-emitter regions reside below the surface of and within the substrate. In some cases, collector-emitter regions on both sides of the slab of semiconductor material are created by implantation through respective trenches. In this way, the separation between the collector-emitter regions is smaller, which may lower $V_{CEON}$ during periods of conduction, and also may lower leakage current between the collector-emitter regions and associated base regions during non-conductive periods.

Figure 3:
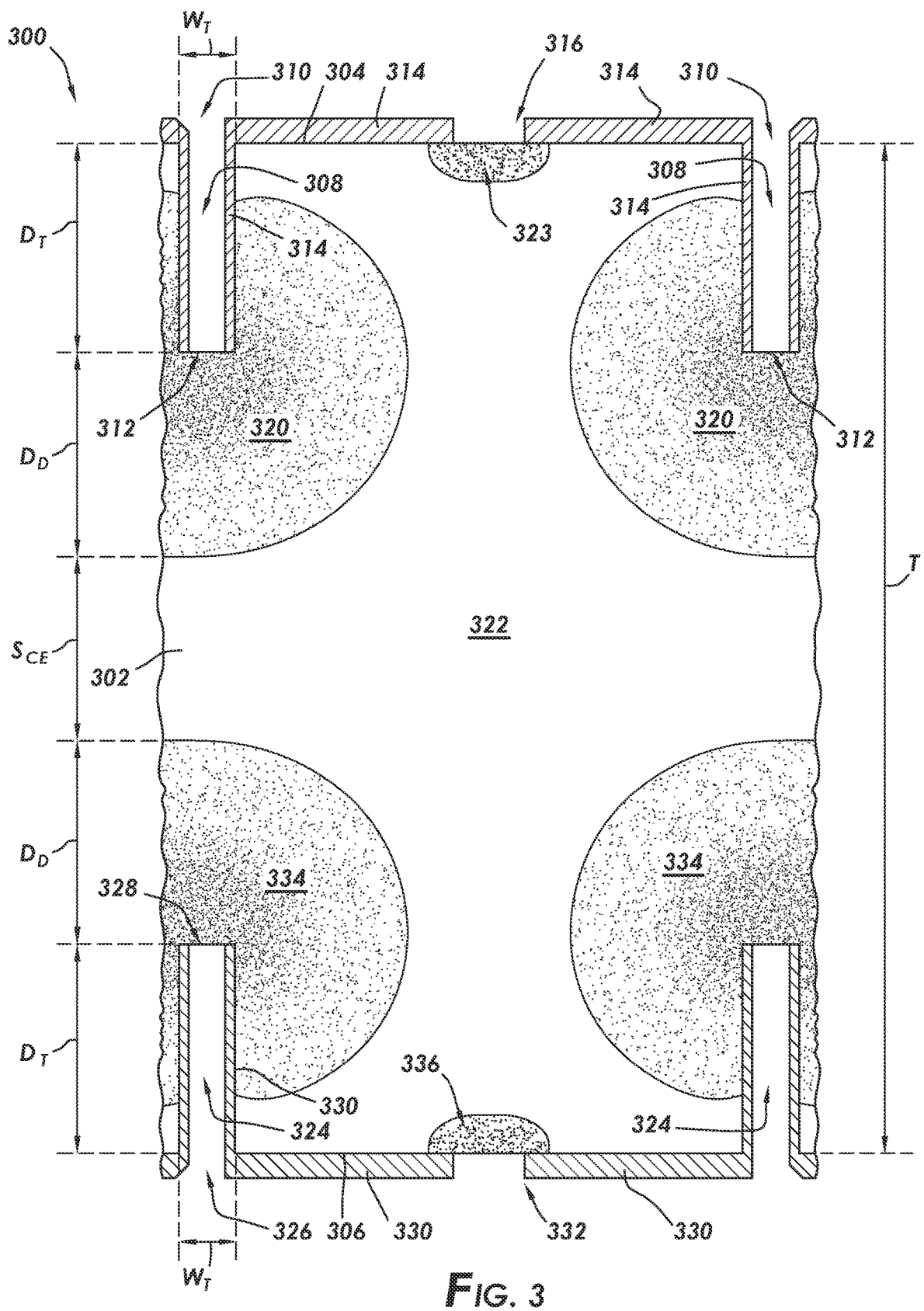
FIG. 3 shows a cross-sectional view of a portion of B-TRAN in accordance with at least some embodiments.

FIG. 3 shows a cross-sectional view of a portion of an example B-TRAN 300. In particular, FIG. 3 shows a B-TRAN 300 comprising a substrate 302 of semiconductor material having an upper face or upper side 304 and a lower face or lower side 306. As before, the designations "upper" and "lower" are arbitrary and used merely for convenience of the discussion. The upper side 304 faces a direction opposite the lower side 306. Stated differently, an outward pointing vector normal to the average elevation of the upper side 304 (the vector not specifically shown) points an opposite direction with respect to an outward pointing vector normal to the average elevation of the lower side 306 (the vector not specifically shown).

The upper side 304 includes an upper collector-emitter trench 308 (hereafter, upper-CE trench 308). The example upper-CE trench 308 defines an open end or proximal opening 310 and a bottom or distal end 312, the distal end 312 disposed within the substrate 302. The upper-CE trench 308 may be created within the substrate using any suitable technique, such as plasma etching. The upper-CE trench 308 defines a depth DT measured from the upper side 304 to the distal end 312. Moreover, the upper-CE trench 308 defines width WT. In example cases, the ratio of the depth of a trench to the width of the trench may be 5:1 or less (e.g., 4:1, 2:1). For example, for a trench that has a depth DT of 10 microns, the width WT may be at least 2 microns. For a device voltage rating of between about 600V and 1200V, and a wafer thickness of 250 microns, the example upper-CE trench 308 may have a depth DT of between and including 10 and 50 microns, and thus may have a width WT of at least 2 microns to at least 10 microns, respectively. For a device voltage rating of between about 600V and 1200V, and a wafer thickness of 300 microns, the example upper-CE trench 308 may have a depth DT of between and including 35 and 75 microns, and thus may have a width WT of at least 6 microns to at least 15 microns, respectively.

Still referring to FIG. 3, the example upper-CE trench 308 is associated with an oxide layer 314. In particular, as part of the manufacturing process, an oxide layer 314 is grown or otherwise created at least on the sidewalls of the example upper-CE trench 308. In practice, the oxide layer 314 may initially cover all surfaces of the upper side 304, but then may be etched (e.g., plasma etch, wet etch) to create various openings, such as an opening at the distal end 312 of the upper-CE trench 308, and the base opening 316 to expose an upper base region, discussed more below. The example oxide layer 314 may serve several purposes. The oxide layer 314 may act as a barrier during creation of the upper collector-emitter region (discussed more below). Further, the oxide layer 314 may act to electrically insulate an electrical connection (e.g., metal, not shown) associated with the upper collector-emitter region from the doped and un-doped semiconductor material around the upper-CE trench 308.

The example B-TRAN 300 comprises an upper collector-emitter region 320 associated with the upper side 304, and which forms a junction with the bulk or drift region 322. Unlike the collector-emitter region 106 of the B-TRAN 100 of FIG. 1, the upper collector-emitter region 320 may be created by placing dopant material through the distal end 312 of the upper-CE trench 308. That is, for example, rather than the dopant impinging on the upper side 304 during implant, the dopant travels along the upper-CE trench 308 and impinges on the semiconductor material exposed at the distal end 312 of the upper-CE trench 308. Such implantation may be referred to as trench-tip implantation. In other cases, to improve minority carrier lifetime, a phosphoryl chloride (POCL3) diffusion process through the upper-CE trench 308 may be used. Regardless of the method used, the result of trench-tip doping and the diffusion depth DD is that the upper collector-emitter region 320 resides below the upper side 304 and deeper within the substrate 302 compared to implantation by having the dopant impinge directly on the upper side (e.g., FIG. 1). Stated otherwise, in one example the dopant that forms the upper collector-emitter region 320 does not intersect or reside at the upper side 304.

The upper side 304 is further associated a base region 323 disposed in association with the collector-emitter region 320. In the example of FIG. 3, the base region 323 is created by dopant impinging on the upper side 304 during implantation. In other cases, to improve minority carrier lifetime, a boron tribromide (BBr3) diffusion process may be used. It follows that the dopant that forms the base region 323 intersects or resides at the upper side 304 and extends into the substrate 302 to a diffusion depth (not specifically delineated). The junction depth of base region 323 and C-E region 320 is designed based on BTRAN electrical performance, e.g. higher Breakdown voltage usually requires deeper junction depth.

Similarly, the lower side 306 includes a lower collector-emitter trench 324 (hereafter, lower-CE trench 324). The example lower-CE trench 324 defines an open end or proximal opening 326 and a bottom or distal end 328, the distal end 328 disposed within the substrate 302. The lower-CE trench 324 may be created within the substrate using any suitable technique, such as plasma etching. The lower-CE trench 324 defines a depth DT measured from the lower side 306 to the distal end 328. Moreover, the lower-CE trench 324 defines width WT. As with the upper-CE trench, the ratio of the depth of the lower-CE trench 324 to the width of the trench may be 5:1 or less (e.g., 4:1, 2:1). The example lower-CE trench 324 may have a depth DT of between and including 10 and 50 microns, and thus may have a width WT of at least 2 microns to at least 10 microns, respectively.

Still referring to FIG. 3, the example lower-CE trench 324 is associated with an oxide layer 330. In particular, as part of the manufacturing process, the oxide layer 330 is grown or otherwise created at least on the sidewalls of the example lower-CE trench 324. In practice, the oxide layer 330 may initially cover all surfaces of the lower side 306, but then may be etched (e.g., plasma etch, wet etch) to create various openings, such as an opening at the distal end 328 of the lower-CE trench 324, and the base opening 332 to expose a lower-base region, discussed more below. As before, the example oxide layer 330 may serve several purposes. The oxide layer 330 may act as a barrier during creation of the lower collector-emitter region (discussed more below). Further, the oxide layer 332 may act to electrically insulate the electrical connection (e.g., metal, not shown) associated with the lower collector-emitter region from the doped and un-doped semiconductor material around the lower-CE trench 324.

The example B-TRAN 300 comprises a lower collector-emitter region 334 associated with the lower side 306, and which forms a junction with the drift region 322. In example cases, the lower collector-emitter region 334 is created by placing a dopant material through the distal end 328 of the lower-CE trench 324. That is, for example, rather than the dopant impinging on the lower side 306 during implantation, the dopant travels along the lower-CE trench 324 and impinges on the semiconductor material exposed at the distal end 328 of the lower-CE trench 324. In other cases, again to improve carrier lifetime, a POCL3 diffusion process through the lower-CE trench 324 may be used. Regardless of the method used, the result of the trench-tip doping and the diffusion depth DD is that the lower collector-emitter region 334 resides beneath the lower side 306 and deeper within the substrate 302 compared to implanting by having the dopant impinge directly on the lower side (e.g., FIG. 1). Stated otherwise, in one example the dopant that forms the lower collector-emitter region 334 does not intersect or reside at the lower side 306.

The lower side 306 is further associated a base region 336 disposed in association with the collector-emitter region 334. In the example of FIG. 3, the base region 336 is created by the dopant impinging on the lower side 306 during implantation. In other cases, to improve minority carrier lifetime, the BBr3 diffusion process may be used. It follows that the dopant that forms the base region 336 intersects or resides at the lower side 306 and extends into the slab of semiconductor material to a diffusion depth (not specifically delineated). The junction depth of base region 336 and C-E region 334 is designed based on BTRAN electrical performance, e.g. higher Breakdown voltage usually requires deeper junction depth.

The various structures and doping associated with the upper side 304 are meant to be mirror images of or congruent with the various structures and doping associated with the lower side 306. However, in some cases the various structures and doping of the upper side 304 are constructed at different times than the various structures and doping of the lower side 306, and thus there may be slight differences in the structures and doping as between the two sides. It follows that the differences may be attributable to variation within manufacturing tolerances, but such does not adversely affect the operation of the device as a bidirectional double-base bipolar junction transistor.

Still referring to FIG. 3, in the example B-TRAN 300 the thickness T of the slab of semiconductor material may be on the order of 250 microns to 300 microns. Taking into account the depths DT of the upper-CE trench 308 and lower-CE trench 324, and the diffusion depths DD of the upper collector-emitter region 320 and lower collector-emitter region 334, the resultant spacing SCE between the collector-emitter regions is significantly reduced compared to the B-TRAN 100 of FIG. 1, in some cases reduced by about 100 microns. The shorter the spacing between upper side 304 collector-emitter region to lower side 306 collector-emitter region, the lower the Vceon. Moreover, the additional distance between the base regions and collector-emitter regions may result lower leakage current when the B-TRAN 300 is non-conductive. The spacing between the upper and lower collector-emitter regions, also referred as drift region width, is also determined by the high-voltage (HV) device's voltage rating. For example, a 1200V HV device may have drift region width between 90 to 160 microns, a 600V HV may have drift region of 45 to 75 microns.

Figure 4:
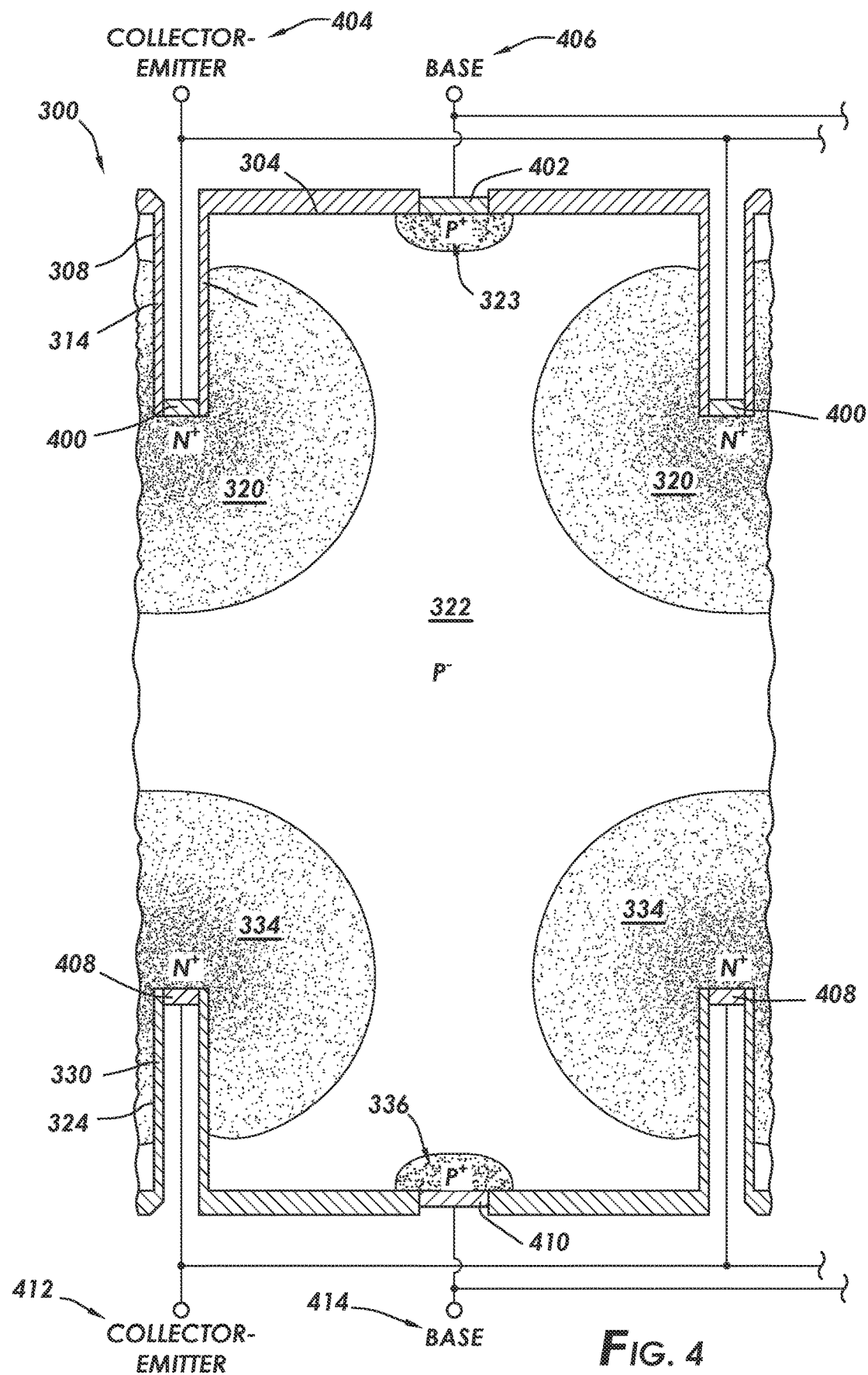
FIG. 4 shows a partial electrical schematic, partial cross-sectional view, of a portion of B-TRAN in accordance with at least some embodiments.

FIG. 4 shows a partial electrical schematic, partial cross-sectional view, of a portion of an example B-TRAN 300. In particular, FIG. 4 shows the B-TRAN 300, including the upper base region 323, the upper collector-emitter region 320 disposed around the distal end of the upper-CE trench 308, the lower base region 336, and the lower collector-emitter region 334 disposed around the distal end of the lower-CE trench 324. In example systems, the upper collector-emitter region 320 is electrically coupled to a collector-emitter contact 400, such as a metallic material applied through a window in the oxide layer 314. Similarly, the base region 323 is electrically coupled to a base contact 402, such as a metallic material applied through a window in the oxide layer 314. In various examples, the material of the collector-emitter contact 400 and base contact 402 is selected and applied in such a way as to form an ohmic contact with the underling semiconductor region (e.g., a salicide process). Stated otherwise, and given the B-TRAN 300 is intended to be a bidirectional device, the contacts 400 and 402 do not form, or form only a very weak, Schottky barrier. In the view of FIG. 4, two collector-emitter contacts 400 are shown, and only one base contact 402 is shown; however, in example systems two or more collector-emitter contact may be implemented, and two or more base contacts may be implemented. The collector-emitter contacts are coupled together to form an upper collector-emitter 404. The base contacts are coupled together to form an upper base 406.

Similarly, the lower collector-emitter region 334 is electrically coupled to a collector-emitter contact 408, such as a metallic material applied through a window in the oxide layer 330. Similarly, the base region 336 is electrically coupled to a base contact 410, such as a metallic material applied through a window in the oxide layer 330. In various examples, the material of the collector-emitter contact 408 and base contact 410 is selected and applied in such way as to form an ohmic contact with the underling semiconductor region. In the view of FIG. 4, two collector-emitter contacts 408 are shown, and only one base contact 410 is shown; however, in example systems two or more collector-emitter contacts may be implemented, and two or more base contacts may be implemented. The collector-emitter contacts are coupled together to form a lower collector-emitter 412. The base contacts are coupled together to form a lower base 414.

The example B-TRAN 300 is shown as an NPN structure, which means the collector-emitter regions 320 and 334 are N-type, the base regions 323 and 336 are P-type, and the bulk substrate is P-type. Note that PNP-type B-TRAN devices are also contemplated but not shown so as not to unduly lengthen the discussion.

Figure 5:
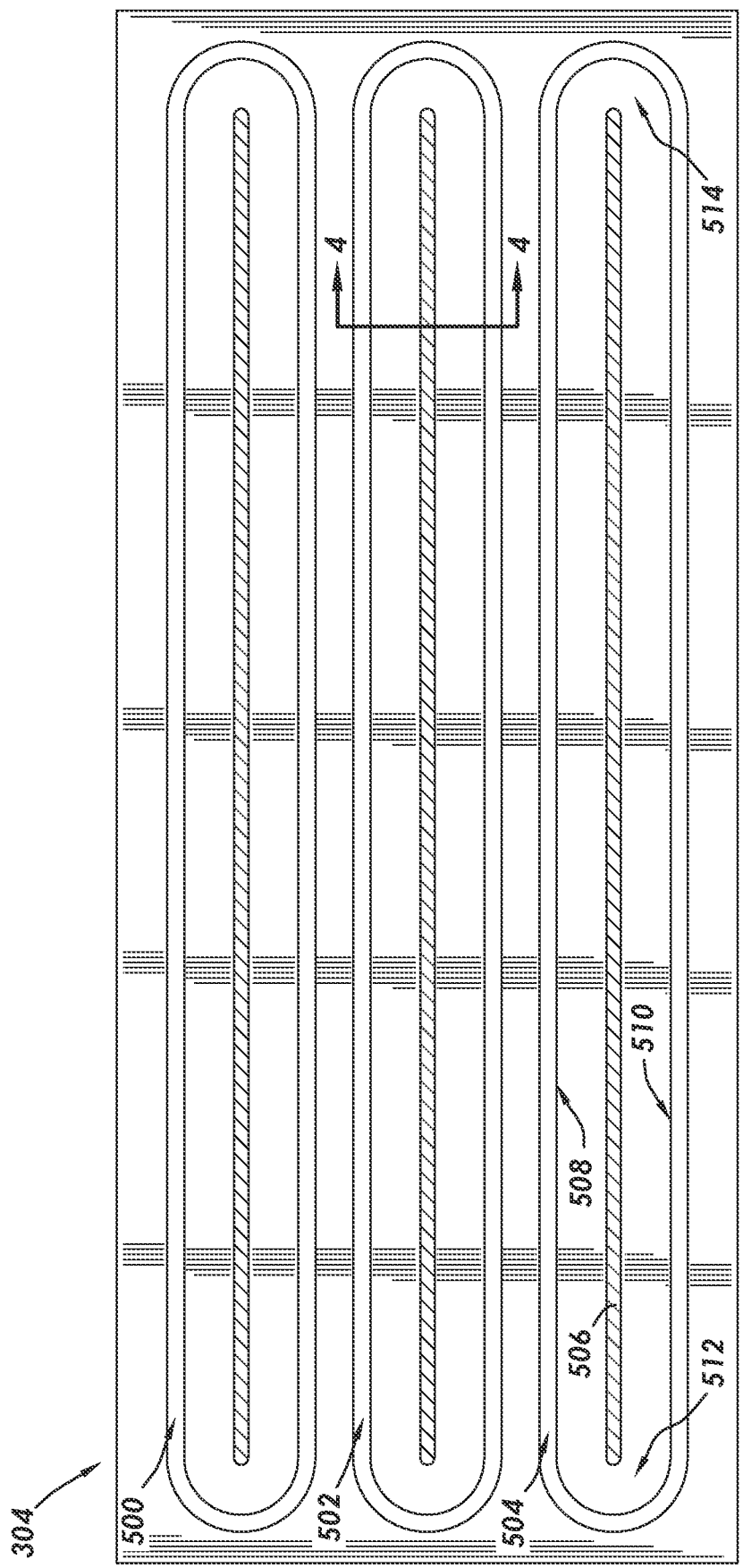
FIG. 5 shows an overhead view of the upper side of a substrate of semiconductor material during an intermediate stage of the construction of a B-TRAN, and in accordance with at least some embodiments.

FIG. 5 shows an overhead view of the upper side 304 of the substrate during an intermediate stage of the construction of the B-TRAN 300 of FIG. 3. In particular, visible in FIG. 5 are three example upper-CE trenches 500, 502, and 504. The collector-emitter regions associated with the upper-CE trenches 500, 502, and 504 are not visible in FIG. 5 given those collector-emitter regions are disposed beneath the surface and thus within the substrate. Defined within the internal boundaries of each upper-CE trench is a base region, such as region 506. For context, the cross-sectional view of FIG. 4 may be considered to be taken along line 4-4 of FIG. 5; however, note that FIG. 5 shows the upper side 304 of the substrate prior to metal deposition that creates the example collector-emitter contact 400 (FIG. 4) and base contact 402 (FIG. 4).

In example cases, and as shown, each upper-CE trench 500, 502, and 504 defines a racetrack pattern or obround. Considering upper-CE trench 504 as representative, the proximal opening of the representative upper-CE trench 504 defines first straight side 508 that is parallel to and offset from a second straight side 510. The proximal opening of the representative upper-CE trench 504 further defines a semi-circular end 512 and a second semi-circular end 514 opposite the first semi-circular end 512.

Considering FIGS. 4 and 5 simultaneously, the two portions of the upper-CE trench 308 shown in FIG. 4 are actually a continuous trench created in the upper side 304. The upper-CE trench 308 defines an open top (open at the upper side 304) and a closed bottom defining the distal end 312. Any consistent feature of the upper-CE trench 308 defines its shape when viewed from above—in the example an obround, but any suitable shape may be used. Similarly, the two portions of the upper collector-emitter region 320 shown in FIG. 4 are actually a continuous collector-emitter region 320 doped through and residing beneath the upper-CE trench 308. Inasmuch as the upper collector-emitter region 320 is implanted through the upper-CE trench 308, the upper collector-emitter region 320 has a similar shape when viewed from above, taking into account isotropic diffusion of the dopant. Thus, if the upper-CE trench 308 defines an obround, so too does the upper collector-emitter region 320. A similar discussion is applicable to lower-CE trench 324 and the lower collector-emitter region 334, but such is not repeated again so as not to unduly lengthen the specification.

Simulations of operation of a B-TRAN 300 show reduced $V_{CEON}$ compared to the B-TRAN 100 of FIG. 1. For example, for a simulated system with an upper-CE trench 308 having a depth DT of 5 microns, but otherwise similar collector-emitter region and base region implantation density, diffusion depths, applied voltage, and collector-base drive current, the B-TRAN 300 showed about a 20% decrease in the voltage drop $V_{CEON}$ (e.g., from about 0.95V to about 0.75V). Stated in terms of collector-emitter current, the B-TRAN 300 showed an increase in current of about 2 Amps (A) at otherwise identical voltage drop $V_{CEON}$ (e.g., increase from 18 A to 20 A for equivalent applied voltage and base-drive current).

Referring again exclusively to FIG. 4. Consider a situation in which an external voltage (e.g., 1200V) is applied across the upper collector-emitter 404 and the lower collector-emitter 412, with the upper collector-emitter 404 being more positive (i.e., the positive terminal). In the "Off" state or non-conductive mode, the lower base 414 is shorted to the lower collector-emitter 412, and the upper base 406 is electrically floated. In the Off state, a depletion region surrounding the lower collector-emitter region 334 expands to prevent current flow through the B-TRAN 300. In the "On" state or conductive mode, the lower base 414 is electrically floated, a drive voltage is applied from the upper collector-emitter 404 to the upper base 406, and current flows from the upper collector-emitter 404 (acting as a collector) to the lower collector-emitter 412 (acting as an emitter).

In the On state a depletion region forms around the upper collector-emitter region, with the size of the depletion region based on the voltage applied from the upper collector-emitter 404 to the upper base 406. In general, increasing the voltage applied to the upper base 406 relative to the upper collector-emitter 404 increases base 406 drive current. Increased base 406 drive current results in increased current flow from the collector to the emitter. However, at some point the increasing voltage of the upper base 406 relative to the upper collector-emitter 404 increases the size of the depletion region around the upper collector-emitter region 320 sufficiently to start to pinch off the drive current supplied from the upper base region 323 to the drift region 322. From that voltage and upward, increasing the voltage of upper base 406 relative to the upper collector-emitter 404 decreases base 406 drive current. Decreased base 406 drive current results in decreased current flow from the collector to the emitter. The point at which the relationship between the voltage at the upper base 406 on the one hand, and the collector to emitter current on the other hand, inverts may be referred to as the inflection point. Stated otherwise, because the example upper collector-emitter regions 320 reside between example base region 323 and the drift region 322, the depletion region around the upper collector-emitter region 320 may act to pinch off the drive current supplied to the base 406. When the external voltage is such that the lower collector-emitter 412 is the positive terminal, the same situation may arise with respect to the lower collector-emitter regions 334 and the lower base region 336.

For B-TRANs designed for current flow at or below inflection point, the base drive current pinch off presents no particular issue. However, for higher power and higher current devices, the location of the base regions may be modified, also using trenches and trench-tip implantation. An example structure is shown in FIG. 6.

Figure 6:
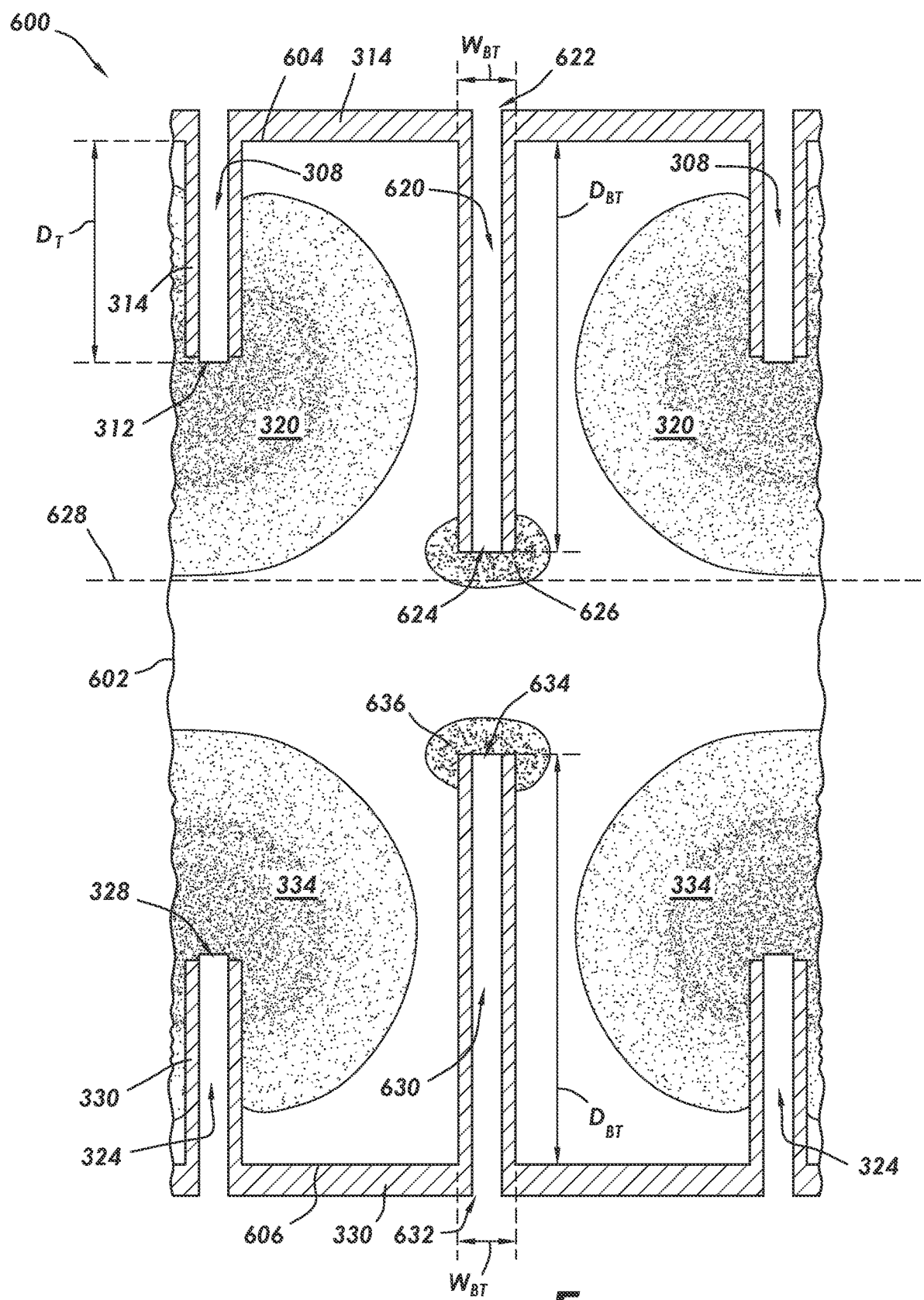
FIG. 6 shows a cross-sectional view of a portion of B-TRAN in accordance with at least some embodiments.

FIG. 6 shows a cross-sectional view of a portion of an example B-TRAN 600. In particular, FIG. 6 shows a B-TRAN 600 comprising a substrate 602 of semiconductor material having an upper face or upper side 604 and a lower face or lower side 606. As before, the designations "upper" and "lower" are arbitrary and used merely for convenience of the discussion. The upper side 604 includes the upper-CE trench 308 and associated oxide layer 314. Further, the upper side 604 has the associated upper collector-emitter region 320. The upper collector-emitter region 320 is likewise associated with collector-emitter contacts 400 (FIG. 4), but the contacts are not included so as not further complicate the figure. Similarly, the lower side 606 includes the lower-CE trench 324 and associated oxide layer 330. Further, the lower side 606 has the associated lower collector-emitter region 334. The lower collector-emitter region 334 is likewise associated with collector-emitter contacts 408 (FIG. 4), but the contacts are not included so as not further complicate the figure.

The example B-TRAN 600 of FIG. 6 includes an upper-base trench 620. The example upper-base trench 620 defines an open end or proximal opening 622 and a bottom or distal end 624, the distal end 624 disposed within the substrate 602. The upper-base trench 620 may be created within the substrate 602 using any suitable technique, such as plasma etching. The upper-base trench 620 defines a depth DBT measured from the upper side 604 to the distal end 624. Moreover, the upper-base trench 620 defines width WBT. In example cases, the ratio of the depth of a trench to the width of a trench may be 5:1 or less (e.g., 4:1, 2:1). The example upper-base trench 620 may have a depth DBT of between and including 10 and 50 microns, and thus may have a width WT of at least 2 microns to at least 10 microns, respectively. In example cases, and as shown, the upper-base trench 620 may have a depth DBT greater than the depth DT of the upper-CE trench 308.

Still referring to FIG. 6, the example upper-base trench 620 is associated with an oxide layer. In the example shown, oxide layer 314 associated with the upper-CE trench 308 may likewise be associated with the upper-base trench 620. In particular, as part of the manufacturing process, the oxide layer 314 is grown or otherwise created at least on the sidewalls of the example upper-base trench 620. In practice, the oxide layer 314 may initially cover all surfaces of the upper side 604, but then may be etched (e.g., plasma etch, wet etch) to create various openings, such as an opening at the distal end 624 of the upper-base trench 620. As before, the example oxide layer 314 may serve several purposes. The oxide layer 314 may act as an implant barrier during creation of the upper base region (discussed more below). Further, the oxide layer 314 may act to electrically insulate an electrical connection (e.g., metal, not shown) associated with the upper base region from the doped and un-doped semiconductor material around the upper-base trench 620.

Unlike the upper base region 110 of the B-TRAN 100 of FIG. 1, the upper base region 626 is created by doping through the distal end 624 of the upper-base trench 620 (e.g., implant process or a BBr3 diffusion process). The result of the trench-tip doping, and to a lesser extent the diffusion depth of the base region doping (the diffusion depth not specifically delineated), is that the upper base region 626 resides below the upper side 604 and deeper within the substrate 602 compared to implantation by having the dopant impinge directly on the upper side 604. Stated otherwise, the dopant that forms the upper base region 626 does not intersect or reside at the upper side 604. Further, the example upper base region 626 resides below the distal end 312 of the upper-CE trench 308, and in some cases the deepest or lower boundary of the upper base region 626 has about the same depth as the deepest or lower boundary of the upper collector-emitter region 320, as illustrated by dashed line 628.

The example B-TRAN 600 of FIG. 6 includes a lower-base trench 630. The example lower-base trench 630 defines an open end or proximal opening 632 and a bottom or distal end 634, the distal end 634 disposed within the substrate 602. The lower-base trench 630 may be created within the substrate 602 using any suitable technique, such as plasma etching. The lower-base trench 630 defines a depth $D_{BT}$ measured from the lower side 606 to the distal end 634.

Moreover, the lower-base trench 630 defines width $W_{BT}$. In example cases, the ratio of the depth of a trench to the width of a trench may be 5:1 or less (e.g., 4:1, 2:1). The example lower-base trench 630 may have a depth $D_{BT}$ of between and including 10 and 50 microns, and thus may have a width $W_T$ of at least 2 microns to at least 10 microns, respectively. In example cases, the lower-base trench 630 may have a depth $D_{BT}$ greater than the depth of the lower-CE trench 324. In the example of FIG. 6, the depths $D_{BT}$ of the lower-base trench 630 and the upper-base trench 620 are shown to about the same. However, other, non-matching depths are contemplated.

Still referring to FIG. 6, the example lower-base trench 630 is associated with an oxide layer. In the example shown, oxide layer 330 associated with the lower-CE trench 324 may likewise be associated with the lower-base trench 630. In particular, as part of the manufacturing process, the oxide layer 330 is grown or otherwise created at least on the sidewalls of the example lower-base trench 630. In practice, the oxide layer 330 may initially cover all surfaces of the lower side 606, but then may be etched (e.g., plasma etch, wet etch) to create various openings, such as an opening at the distal end 634 of the lower-base trench 630. As before, the example oxide layer 330 may serve several purposes. The oxide layer 330 may act as an implant barrier during creation of the lower base region (discussed more below). Further, the oxide layer 330 may act to electrically insulate an electrical connection (e.g., metal, not shown) associated with the upper base region from the doped and un-doped semiconductor material around the lower-base trench 630.

Unlike the lower base region 126 of the B-TRAN 100 of FIG. 1, the lower base region 636 is created by doping through the distal end 634 of the lower-base trench 630 (e.g., implant process or a BBr3 diffusion process). The result of the trench-tip doping, and to a lesser extent the diffusion depth of the base region implantation (the diffusion depth not specifically delineated), is that the lower base region 636 resides below the lower side 606 and deeper within the substrate 602 compared to implantation by having the dopant impinge directly on the lower side 606. Stated otherwise, the dopant that forms the lower base region 636 does not intersect or reside at the lower side 606. Further, the example lower base region 636 resides below the distal end 328 of the lower-CE trench 324, and in some cases the deepest or lower boundary of the lower base region 636 has about the same depth as the deepest or lower boundary of the lower collector-emitter region 334.

Figure 7:
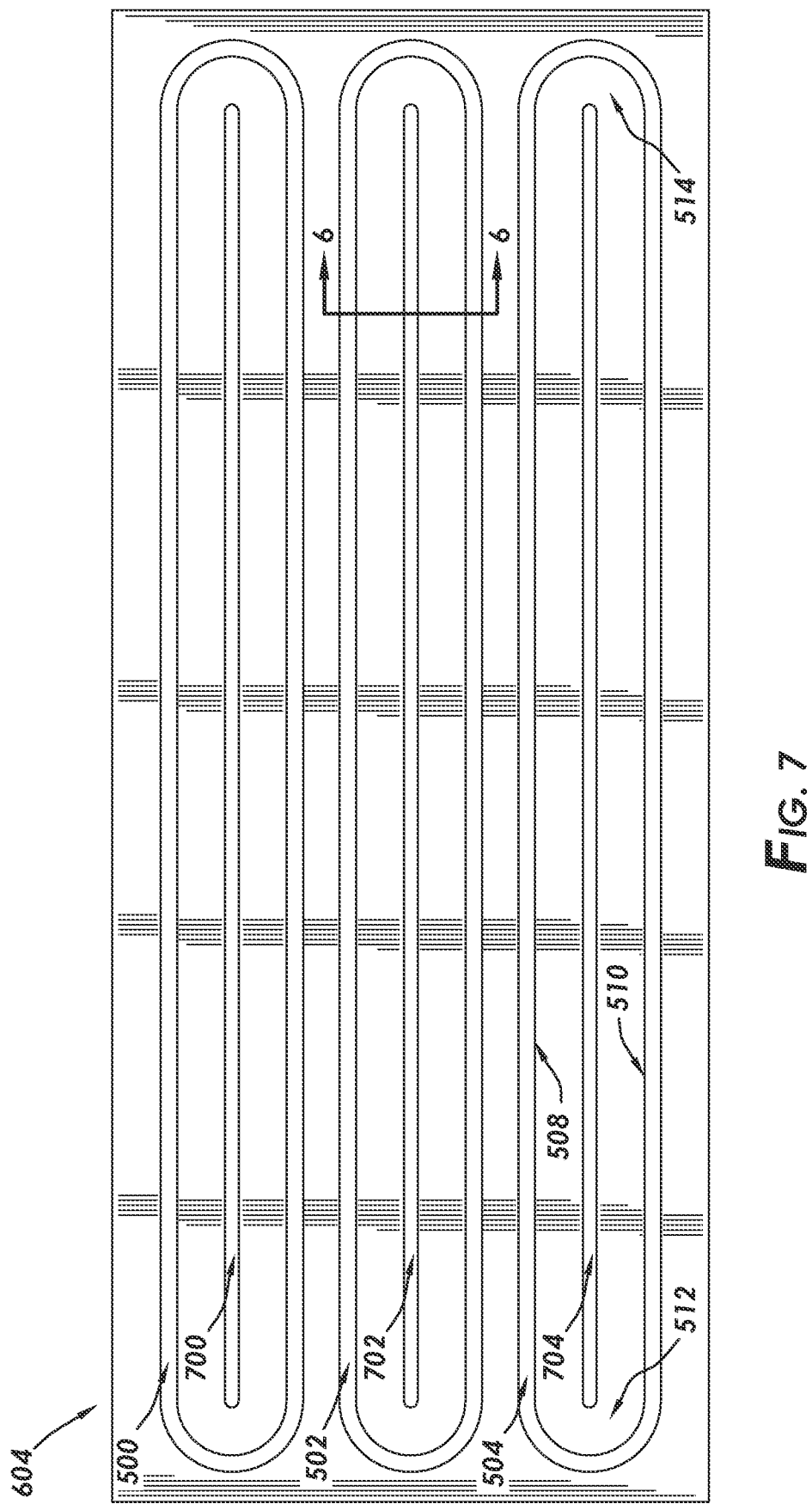
FIG. 7 shows an overhead view of the upper side of a substrate of semiconductor material during an intermediate stage of the construction of the B-TRAN, and in accordance with at least some embodiments.

FIG. 7 shows an overhead view of the upper side 604 of the substrate during an intermediate stage of the construction of the B-TRAN 600 of FIG. 6. In particular, visible in FIG. 7 are three example upper-CE trenches 500, 502, and 504. The collector-emitter regions associated with the upper-CE trenches 500, 502, and 504 are not visible in FIG. 7 given those collector-emitter regions are disposed beneath the surface and thus within the substrate. Defined within the internal boundaries of each upper-CE trench is a base trench, such as upper-base trenches 700, 702, and 704. The base regions associated with the upper-base trenches 700, 702, and 704 are not visible in FIG. 7 given those base regions are disposed beneath the surface and thus within the substrate. For context, the cross-sectional view of FIG. 6 may be considered to be taken along line 6-6 of FIG. 7; however, note that FIG. 7 shows the upper side 604 of the substrate prior to metal deposition that creates the example collector-emitter contacts and base contacts.

In example cases, and as shown, each upper-CE trench 500, 502, and 504 defines a racetrack pattern or obround. Considering upper-CE trench 504 as representative, as before the proximal opening of the representative upper-CE trench 504 defines the first straight side 508 and the second straight side 510. The proximal opening of the representative upper-CE trench 504 further defines the semi-circular ends 512 and 514. The upper-base trenches 700, 702, and 704 reside within and are parallel to their respective upper-CE trenches.

Returning to FIG. 3. The example B-TRAN of FIG. 3 shows collector-emitter regions 320 and 334 created by trench-tip doping, and with the base regions residing at the surface on their respective sides. However, in yet still further cases, the trench-tip doping to create a collector-emitter region may be implemented only one side (e.g., only the upper side 304). In such a case, the collector-emitter regions and base regions of the opposite side would resemble the arrangement of one side of FIG. 1 (i.e., regions created by dopant implant through the surface), and yet such a system may still have reduced voltage drop $V_{CEON}$ compared to the related-art B-TRAN of FIG. 1. For example, the thickness T of the substrate may be reduced, yet the reduced thickness may not support having collector-emitter trenches on both sides (i.e., the effective thickness between the distal ends of collector emitter trenches on opposing sides may be too thin to survive processing).

Returning to FIG. 6. The example B-TRAN of FIG. 6 shows collector-emitter regions 320 and 334 created by trench-tip doping (e.g., implantation, or POCL3 diffusion), and base regions 626 and 636 created by trench-tip doping. However, in yet still further cases, the trench-tip implantation to create the collector-emitter and base regions may be implemented only one side (e.g., only the upper side 304). In such a case, the collector-emitter regions and base regions of the opposite side may resemble the arrangement of one side of FIG. 1 (i.e., regions created by doping through the surface). In another case, the collector-emitter regions and base regions of the opposite side may resemble the arrangement of one side of FIG. 3 (i.e., the upper side implemented as the upper side of FIG. 6, and the lower side implemented as the lower side of FIG. 3). All such combination may have reduced voltage drop $V_{CEON}$ compared to the related-art B-TRAN of FIG. 1. For example, the thickness T of the substrate may be reduced, yet the reduced thickness may not support having the deeper base trenches on both sides (i.e., the effective thickness between the distal ends of collector emitter trenches on opposing sides may be too thin to survive processing). Thus, the upper side may implement the upper-CE trench and upper-base trench, and corresponding regions, and the lower side may have no trenches (e.g., lower side of FIG. 1), or only lower-CE trenches (e.g., lower side of FIG. 3).

Figure 8:
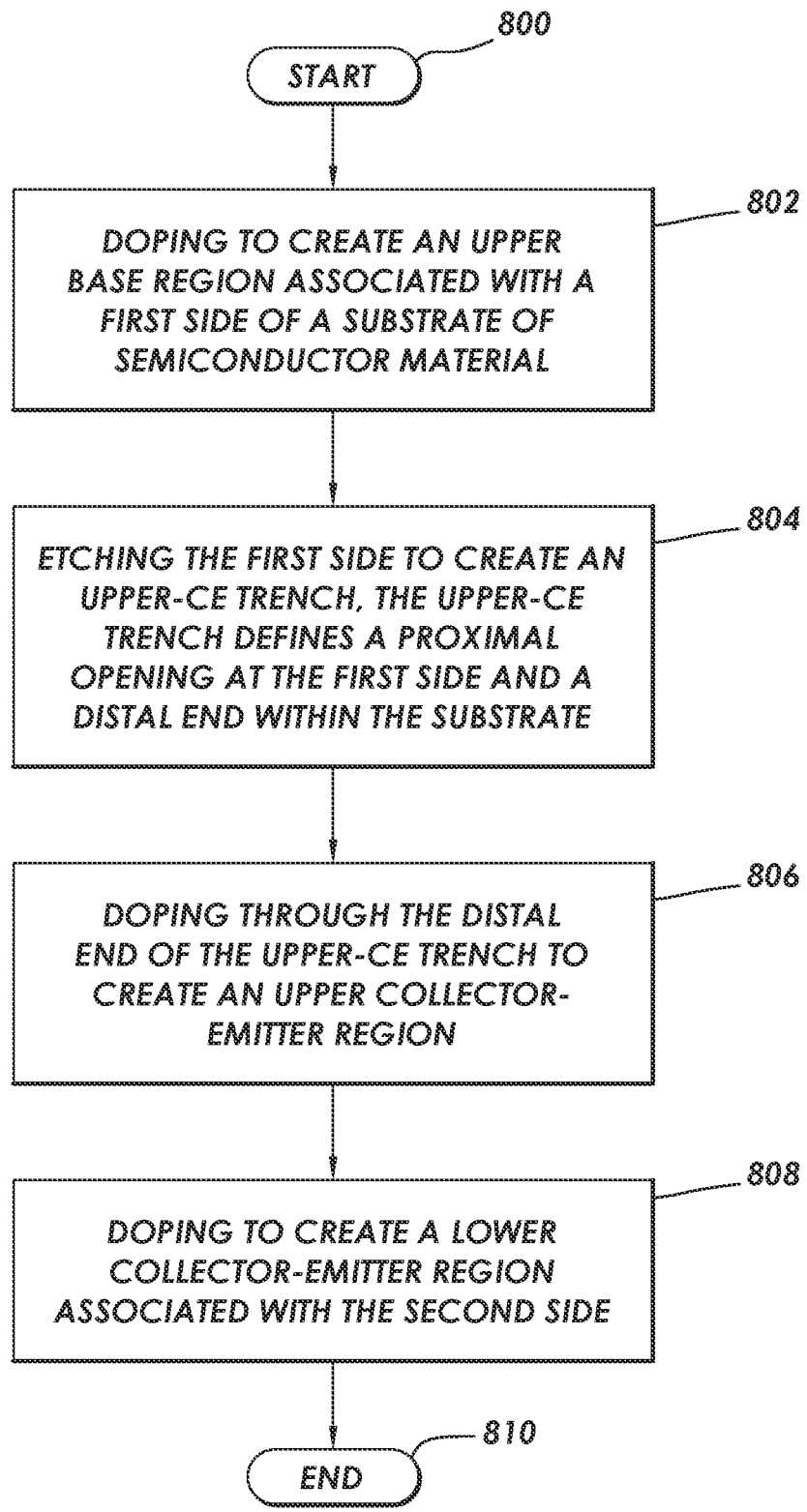
FIG. 8 shows a method in accordance with at least some embodiments.

FIG. 8 shows a method in accordance with at least some embodiments. The example method starts (block 800) and comprises: doping to create an upper base region associated with a first side of a substrate of semiconductor material (block 802); etching the first side to create an upper-CE trench, the upper-CE trench defines a proximal opening at the first side and a distal end within the substrate (block 804); doping through the distal end of the upper-CE trench to create an upper collector-emitter region (block 806); doping to create a lower base region associated with a second side of the substrate (block 808); and implanting to create a lower collector-emitter region associated with the second side (block 810). Thereafter the method ends (block 812).

The above discussion is meant to be illustrative of the principles and various embodiments of the present invention. Numerous variations and modifications will become apparent to those skilled in the art once the above disclosure is fully appreciated. For example, the various structures can be implemented for any semiconductor device with interdigitated structure. It is intended that the following claims be interpreted to embrace all such variations and modifications.

What is claimed is:

1. A method of making a semiconductor device, the method comprising:
   doping to create an upper base region associated with a first side of a substrate of semiconductor material;
   etching the first side to create an upper-CE trench, the upper-CE trench defines a proximal opening at the first side and a distal end within the substrate;
   doping through the distal end of the upper-CE trench to create an upper collector-emitter region;
   doping to create a lower base region associated with a second side of the substrate; and
   doping to create a lower collector-emitter region associated with the second side.

2. The method of claim 1 wherein etching to create the upper-CE trench further comprises etching such that the upper-CE trench defines a depth of between and including 10 and 75 microns.

3. The method of claim 1:
   further comprising, prior to doping to create the upper base region, etching the first side to create an upper-base trench, the upper-base trench defines a proximal opening at the first side and a distal end within the substrate of semiconductor material; and
   wherein doping to create the upper base region further comprises doping through the distal end of the upper-base trench.

4. The method of claim 3 wherein the upper-base trench defines a first depth, the upper-CE trench defines a second depth, and the first depth is greater than the second depth.

5. The method of claim 1 further comprising, prior to doping to create the lower collector-emitter region:
   etching the second side of the substrate to create a lower-CE trench, the lower-CE trench defines a proximal opening at the second side and a distal end within the substrate of semiconductor material; and
   wherein doping to create the lower collector-emitter region further comprises doping through the distal end of the lower-CE trench.

6. The method of claim 5 further comprising:
   prior to doping to create the upper base region, etching the first side to create an upper-base trench, the upper-base trench defines a proximal opening on the first side and a distal end within the substrate of semiconductor material;
   wherein doping to create the upper base region further comprises doping through the distal end of the upper-base trench;
   prior to doping to create the lower base region, etching the second side to create a lower-base trench, the lower-base trench defines a proximal opening on the second side and a distal end within the substrate of semiconductor material; and
   wherein doping to create the lower base region further comprises doping through the distal end of the lower-base trench.

7. The method of claim 6:
   wherein the upper-base trench defines a first depth, the upper-CE trench defines a second depth, and the first depth is greater than the second depth; and
   wherein the lower-base trench defines a third depth, the lower-CE trench defines a fourth depth, and wherein the third depth is greater than the fourth depth.

8. The method of claim 6 further comprising:
   placing a first layer of oxide on sidewalls of the upper-CE trench;
   placing a second layer of oxide on sidewalls of the upper-base trench;
   placing a third layer of oxide on sidewalls of the lower-CE trench; and
   placing a fourth layer of oxide on sidewalls of the lower-base trench.

9. The method of claim 1 wherein doping to create the upper base region further comprising implanting to create a P-type upper base region, and wherein doping to create the upper collector-emitter region further comprising implanting to create a P-type collector-emitter region.

10. A method of making a semiconductor device, the method comprising:
    doping to create an upper base region associated with a first side of a substrate of semiconductor material;
    etching the first side to create an upper-CE trench, the upper-CE trench defines a proximal opening at the first side and a distal end within the substrate;
    doping through the distal end of the upper-CE trench to create an upper collector-emitter region;
    doping to create a lower base region associated with a second side of the substrate; and
    etching the second side of the substrate of semiconductor material to create a lower-CE trench, the lower-CE trench defines a proximal opening at the second side and a distal end within the substrate; and
    doping through the distal end of the lower-CE trench to create a lower collector-emitter region.

11. The method of claim 10 wherein etching to create the upper-CE trench further comprises etching such that the upper-CE trench defines a depth of between and including 10 and 75 microns.

12. The method of claim 11 wherein etching to create the lower-CE trench further comprises etching such that the lower-CE trench defines a depth of between and including 10 and 75 microns.

13. The method of claim 10:
    prior to doping to create the upper base region, etching the first side to create an upper-base trench, the upper-base trench defines a proximal opening at the first side and a distal end within the substrate of semiconductor material, wherein doping to create the upper base region further comprises doping through the distal end of the upper-base trench;
    prior to doping to create the lower base region, etching the second side to create a lower-base trench, the lower-base trench defines a proximal opening at the second side and a distal end within the substrate of semiconductor material, wherein doping to create the lower base region further comprises doping through the distal end of the lower-base trench.

14. The method of claim 13 wherein the upper-base trench defines a first depth, the upper-CE trench defines a second depth, and the first depth is greater than the second depth.

15. The method of claim 14 wherein the lower-base trench defines a third depth, the lower-CE trench defines a fourth depth, and the third depth is greater than the fourth depth.

16. The method of claim 13 further comprising:
    placing a first layer of oxide on sidewalls of the upper-CE trench;

placing a second layer of oxide on sidewalls of the upper-base trench;

placing a third layer of oxide on sidewalls of the lower-CE trench; and placing a fourth layer of oxide on sidewalls of the lower-base trench.

17. The method of claim 10 wherein doping to create the upper base region further comprising implanting to create a P-type upper base region, and wherein doping to create the upper collector-emitter region further comprising implanting to create a P-type collector-emitter region.

* * * * *